(12) United States Patent
Shiga (10) Patent No.: US 7,978,512 B2
(45) Date of Patent: Jul. 12, 2011

(54) SEMICONDUCTOR MEMORY SYSTEM

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/557,898

(22) Filed: Sep. 11, 2009

(65) Prior Publication Data

US 2010/0080056 A1    Apr. 1, 2010

(30) Foreign Application Priority Data

Sep. 29, 2008    (JP) .................................. 2008-249531

(51) Int. Cl.
*G11C 16/04*    (2006.01)
(52) U.S. Cl. ......... 365/185.03; 365/185.09; 365/185.18; 365/200
(58) Field of Classification Search ............. 365/185.03, 365/185.09, 185.18, 200
See application file for complete search history.

(56) References Cited

U.S. PATENT DOCUMENTS

| | | | |
|---|---|---|---|
| 6,646,913 B2 | 11/2003 | Micheloni et al. | |
| 7,447,066 B2 * | 11/2008 | Conley et al. ............ | 365/185.03 |
| 2008/0301532 A1 | 12/2008 | Uchikawa et al. | |

FOREIGN PATENT DOCUMENTS

| | | |
|---|---|---|
| JP | 7-234823 | 9/1995 |
| JP | 2001-250386 | 9/2001 |
| JP | 2005-63662 | 3/2005 |
| JP | 2008-77810 | 4/2008 |

OTHER PUBLICATIONS

Office Action issued Nov. 16, 2010, in Japan Patent Application No. 2008-249531 (with English translation).
U.S. Appl. No. 12/405,754, filed Mar. 17, 2009, Hitoshi Shiga et al.
Japanese Office Action issued on Feb. 1, 2011, in the corresponding Japanese Patent Application No. 2008-249531 (with English Translation).

* cited by examiner

*Primary Examiner* — David Lam
(74) *Attorney, Agent, or Firm* — Oblon, Spivak, McClelland, Maier & Neustadt, L.L.P.

(57) ABSTRACT

A semiconductor memory system includes: a memory cell array having a plurality of memory cells arranged therein, the plurality of memory cells capable of storing N bits of information in each memory cell (where N is a natural number more than 3, other than a power of two); a control circuit configured to control read, write, and erase operations on the memory cell array; and an ECC circuit configured to correct data read from the memory cell array, based on redundant data. The memory cells that share one of word lines and can be written or read at a time are configured to store multiple pages of data therein. A total amount of data stored in the multiple pages is set to a power-of-two number of bits, and the redundant data is stored in a residual portion of the multiple pages.

20 Claims, 7 Drawing Sheets

SEMICONDUCTOR MEMORY SYSTEM

CROSS-REFERENCE TO RELATED APPLICATIONS

This application is based upon and claims the benefit of priority from the prior Japanese Patent Application No. 2008-249531, filed on Sep. 29, 2008, the entire contents of which are incorporated herein by reference.

BACKGROUND OF THE INVENTION

1. Field of the Invention

The present invention relates to a non-volatile semiconductor storage system, and particularly, to a nonvolatile semiconductor storage device enabled to store multiple bits in one memory cell.

2. Description of the Related Art

One of the well-known non-volatile semiconductor storage systems is a NAND cell type flash memory. The NAND cell type flash memory includes a memory cell array including a plurality of NAND cell units. Each NAND cell unit includes a plurality of memory cells connected in series and two selection transistors connected to both ends thereof.

The memory cell holds, in an erase state, data "1" and has a negative threshold voltage. In a data write operation, a floating gate of the memory cell is injected with electrons to write data "0", and the memory cell has a positive threshold voltage. The NAND cell type flash memory may change the threshold voltage of the memory cell only from a lower value to a higher value in a data write operation, and may change the threshold voltage in the reverse direction (from a higher value to a lower value) only by an erase operation per block.

To increase memory capacity, current developments are directed to a so-called multi-value NAND cell type flash memory that stores two or more bits of information in one memory cell. For example, when 3 bits are stored in one memory cell, one memory cell involves $2^3=8$ different threshold voltage distributions (see, for example, Japanese Patent Laid-Open No. 2008-077810).

Meanwhile, since the NAND cell type flash memory is usually controlled in a unit of power-of-two bits of data, host devices utilizing such the NAND cell type flash memory are also designed for data control in a unit of power-of-two bits of data.

However, in the NAND cell type flash memory where 3 bits are stored in one memory cell, for example, the amount of data that is subject to data-erase at a time in a data erase unit (block) is not a power-of-two bits of data. As such, there may be a mismatch (discrepancy) between the logic block size of a host device and the data erase unit of the NAND cell type flash memory. Consequently, such situations frequently arise where data copy operations are required within the system, causing additional overhead in the system. This may result in serious disruption to normal operation in some applications, such as video recording that requires data write/read to be performed in a continuous manner. This issue may arise not only when performing multi-value storage of 3 bits per cell, but also when performing that of N bits per cell (where N is a natural number more than 3, other than a power of two).

SUMMARY OF THE INVENTION

One aspect of the present invention provides a semiconductor memory system comprising: a memory cell array having a plurality of memory cells arranged therein, the plurality of memory cells capable of storing N bits of information in each memory cell (where N is a natural number more than 3, other than a power of two) ; a control circuit configured to control read, write, and erase operations on the memory cell array; and an ECC circuit configured to correct data read from the memory cell array, based on redundant data, the memory cells that share one of word lines and can be written or read at a time being configured to store multiple pages of data therein, a total amount of data stored in the multiple pages being set to a power-of-two number of bits, and the redundant data being stored in a residual portion of the multiple pages.

Another aspect of the present invention provides a semiconductor memory system comprising: a memory cell array having a plurality of memory cells arranged therein, the plurality of memory cells capable of storing N bits of information in each memory cell (where N is a natural number more than 3, other than a power of two); and a control circuit configured to control read, write, and erase operations on the memory cell array, the memory cell array comprising: a binary memory region configured to store 1 bit of information in one of the memory cells; and a multi-value memory region formed to store the N bits of information in one of the memory cells, the control circuit being operative to store in the binary memory region data supplied from outside in a unit of data with a power-of-two number of bits to be written to the memory cell array, and then sequentially transfer the data stored in the binary memory region to the multi-value memory region; the memory cells that share one of word lines and can be written or read at a time being configured to store multiple pages of data therein; and a total amount of data stored in the multiple pages being set to a power-of-two number of bits, and the redundant data being stored in a residual portion of the multiple pages.

DETAILED DESCRIPTION OF THE EMBODIMENTS

Embodiments of the present invention will now be described in detail below with reference to the accompanying drawings.

First Embodiment

Figure 1:
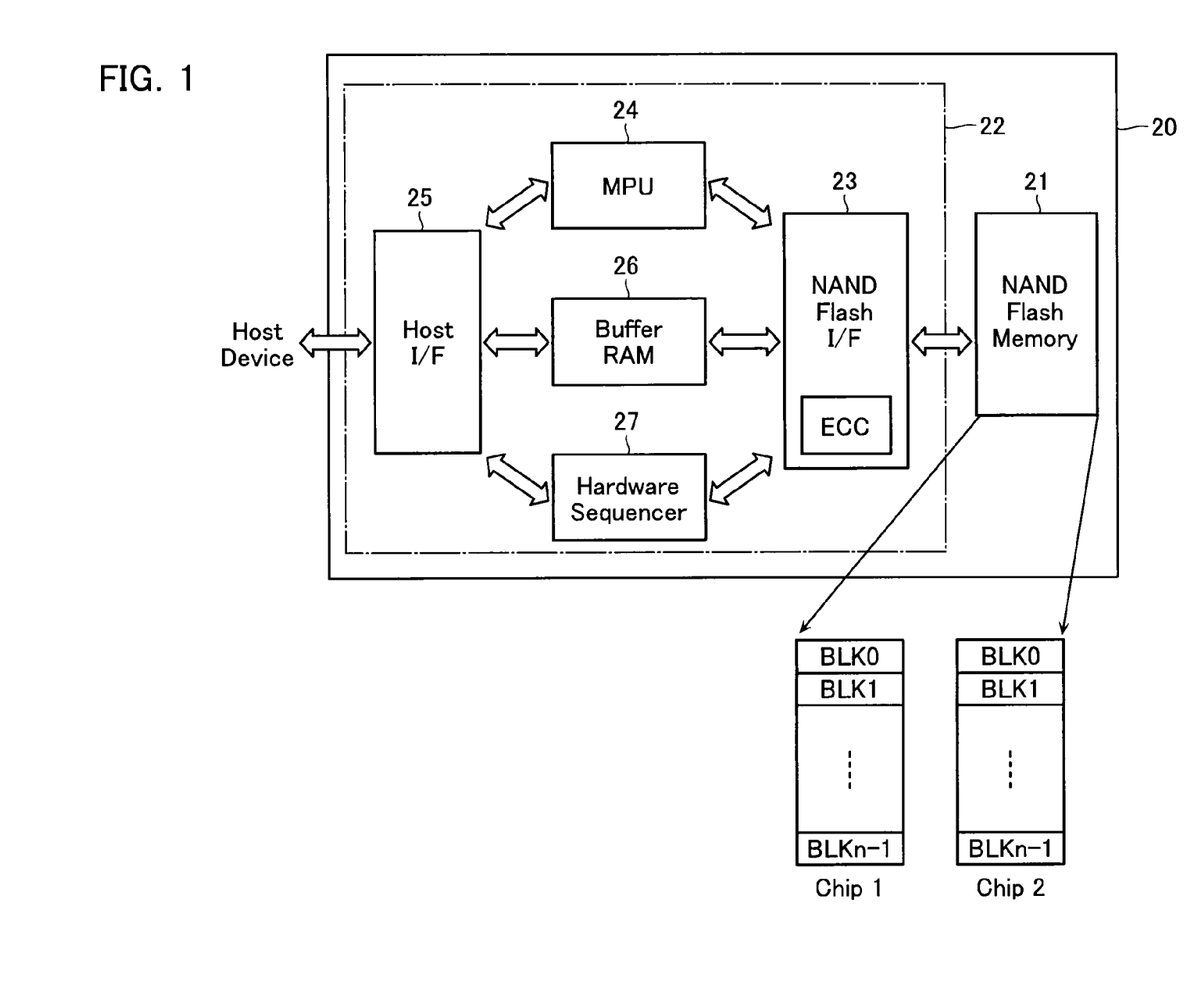
FIG. 1 illustrates a general configuration of a memory card 20, which represents a non-volatile memory system according to a first embodiment of the invention.

Referring first to FIG. 1 and the like, a non-volatile memory system according to a first embodiment of the present invention will be described below.

[System Overview]

FIG. 1 illustrates a general configuration of a memory card 20, which represents the non-volatile memory system according to the first embodiment of the invention. The memory card 20 configures modules with a NAND-type flash memory chip 21 and a memory controller 22. The memory controller 22 controls reading/writing from/to the NAND-type flash memory chip 21.

The flash memory chip 21 may be a plurality of memory chips. Although FIG. 1 illustrates two memory chips, i.e., chip 1 and chip 2, these are also controlled by the single memory controller 22. The memory controller 22 is a one-chip controller that has a NAND flash interface 23, a host interface 25, a buffer RAM 26, an MPU 24, and a hardware sequencer 27. The NAND flash interface 23 is used for transferring data to and from the memory chip 21. The host interface 25 is used for transferring data to and from a host device. The buffer RAM 26 is used for temporarily retaining read/write data, etc. The MPU 24 is used for controlling, not only data transfer, but also entire operations in the memory card. The hardware sequencer 27 is used for e.g., sequence control of read/write of firmware (FW) within the NAND-type flash memory 21.

When the memory card 20 is powered on, an initializing operation (power-on initial setup operation) is performed to automatically read firmware (control program) stored in the flash memory 21, which in turn is transferred to the data register (buffer RAM) 26. This read control operation is performed by the hardware sequencer 27.

Using the firmware loaded on the buffer RAM 26, the MPU 24 creates tables on the RAM 26, accesses the flash memory 21 in response to commands from the host, controls data transfer, and so on. In addition, the NAND flash interface 23 comprises an ECC circuit for performing error correction on effective data that is stored in the flash memory chip 21, based on redundant data that is also stored in the flash memory chip 21. As described below, the ECC circuit is configured to perform error correction in a unit of three pages of data that are stored in memory cells MC (3 bits per cell) formed along one word line WL, rather than performing it in a unit of one page.

Figure 2:
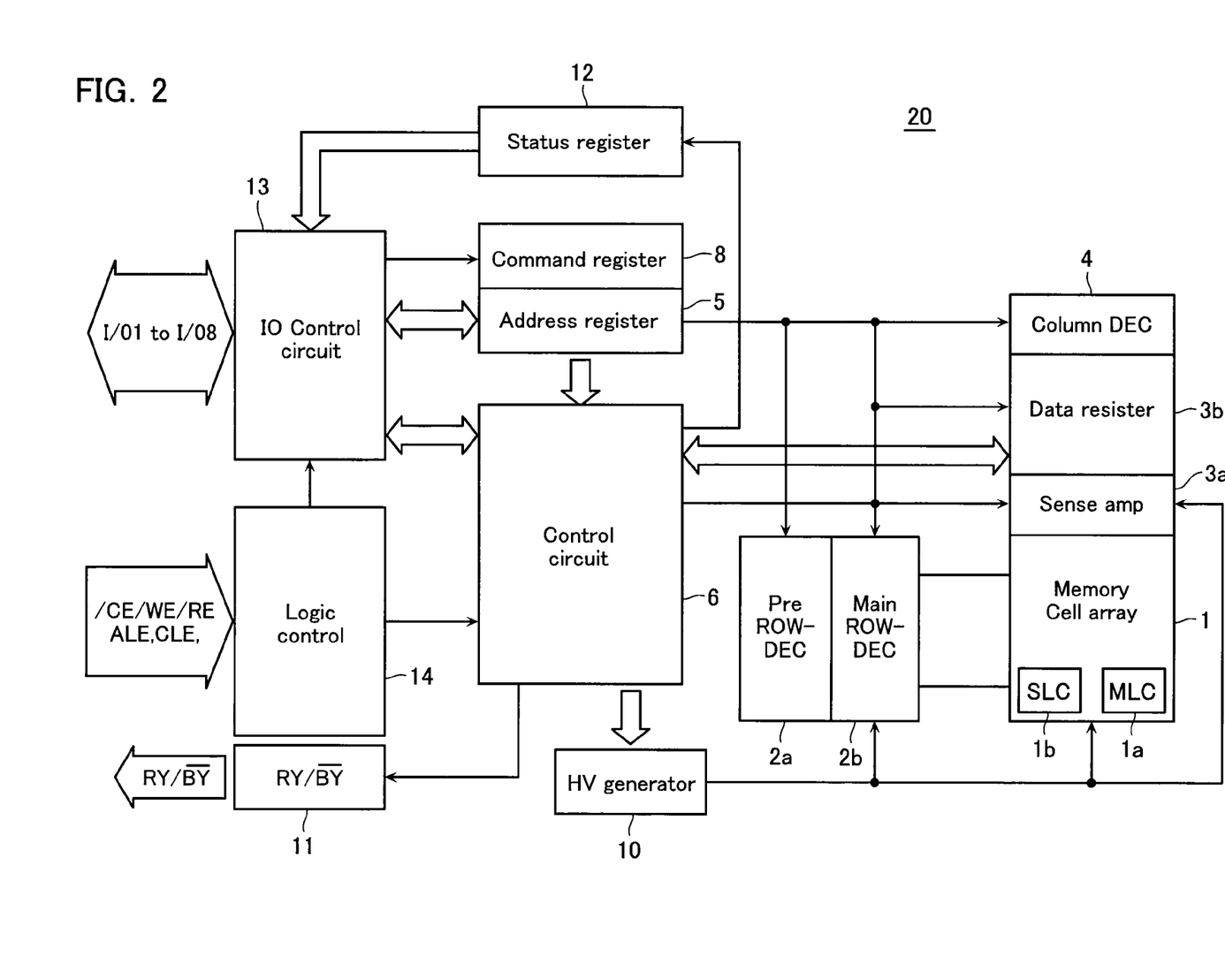
FIG. 2 is illustrates a configuration of functional blocks where a logic control is described in an integrated manner for the memory chip 21 and the controller 22 of the memory card 20 of FIG. 1.

However, it is not essential for the present memory system that the memory chip 21 and the controller chip 22 are separate chips. FIG. 2 illustrates a configuration of functional blocks of the memory card 20, where a logic control of the memory chip 21 and the controller 22 is illustrated in an integrated manner. In addition, FIG. 3 illustrates a configuration of a cell array in a memory core portion.

Figure 3:
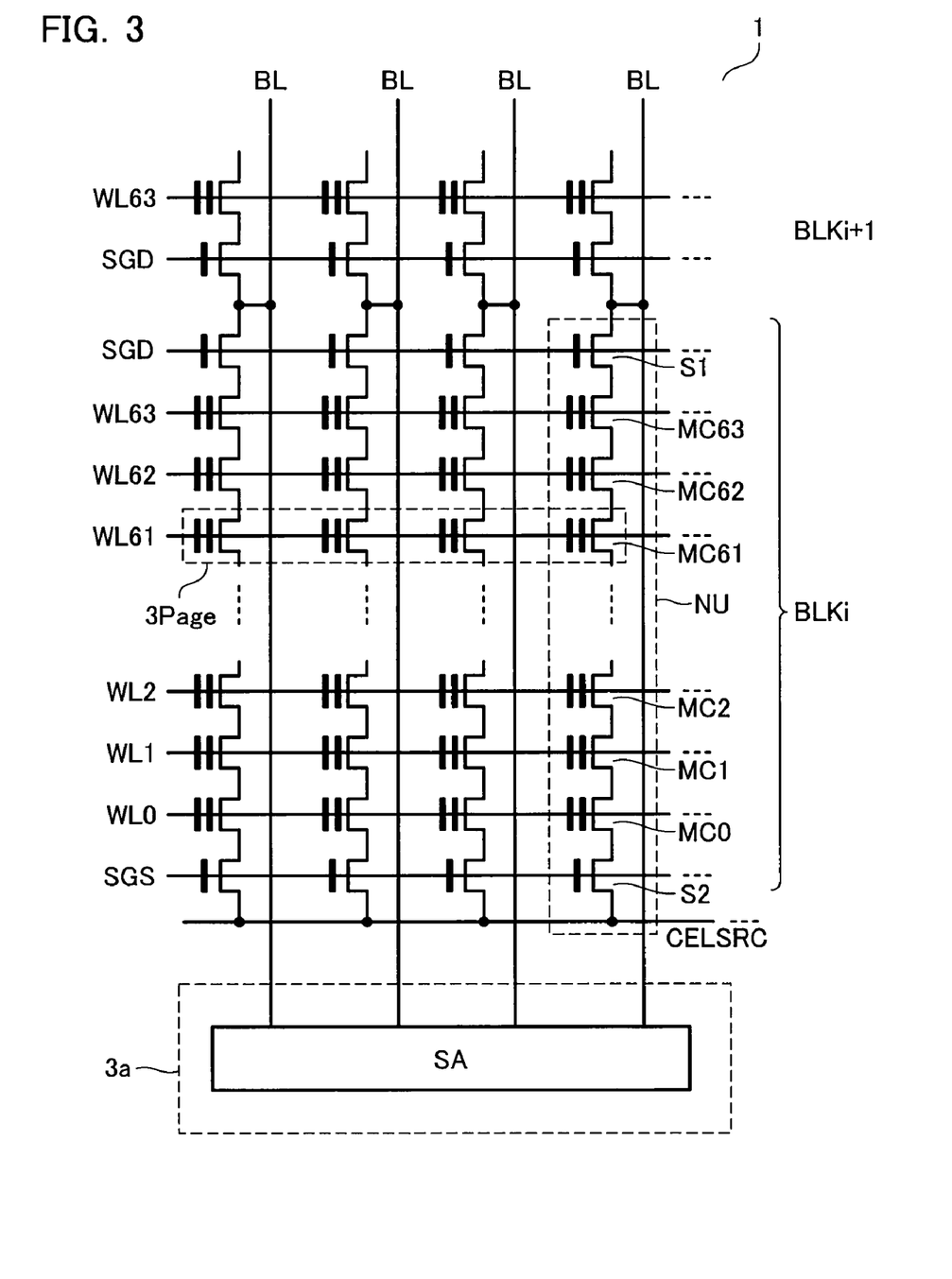
FIG. 3 is a circuit diagram illustrating a specific configuration of the memory cell array 1.

As illustrated in FIG. 3, a memory cell array 1 includes NAND cell units (NAND strings) NU arranged therein, each of which has a plurality of electrically rewritable non-volatile memory cells (in FIG. 3, 64 memory cells) M0-M63 connected in series. A power-of-two number+α, e.g., 16k+α pieces of such NAND cell units NU together form one block BLK, sharing the corresponding word lines WL.

Among 16k+α, 16k NAND cell units NU are mainly used for storing effective data supplied from an external host device, while the remaining α NAND cell units are provided for storing redundant data and management flags for error correction.

One block BLK forms one unit for data erase operation. In addition, when 3 bits of data are stored in one memory cell MC (3 bits per cell), three pages (upper page UPPER, middle page MIDDLE, and lower page LOWER) of data are stored by memory cells MC that are formed along one word line WL. In this embodiment, the number of bits of effective data to be stored in one page is controlled so that three pages of data stored in the memory cells MC along one word line WL and capable of being written or read at a time correspond to power-of-two bits of effective data (the number of bits of effective data in each page is not power of two bits). This is described in greater detail below.

The number of word lines WL included in one block in one memory cell array 1 is 64, and the number of pages included in one block is 64×3=192.

Given that the number of memory cells MC (the number of bit lines BL) along one word line WL is 16k+α, each block in one memory cell array 1 has a capacity of 64×16k×3=3 Mbits (in the case of storing 3 bits in each memory cell).

In addition, the memory cell array 1 of this embodiment comprises a multi-value memory region (MLC) 1a for storing multi-value data and a binary memory region (SLC) 1b for storing binary data. It is, however, also possible to form only the multi-value memory region 1a, omitting the binary memory region 1b.

As illustrated in FIG. 3, one end of each of the NAND cell units NU is connected via a selection gate transistor S1 to a respective bit line BL, and the other end connected via a selection gate transistor S2 to a common source line CELSRC. The control gates of the memory cells M0 to M63 are connected to respective word lines WL0-WL31. The gates of the selection gate transistors S1, S2 are connected to respective selection-gate lines SGD, SGS.

A sense amplifier circuit 3a, which is utilized to read and write cell data, is positioned at one end of each of the bit lines BL, and a row decoder 2 (not illustrated in FIG. 3), which selectively drives each word line and selection-gate line, is positioned at one end of each of the word lines WL.

Commands, addresses and data are input via an input control circuit 13. Chip-enable signals/CE, write-enable signals/WE, read-enable signals/RE, and other external control signals are input to a logic circuit 14 for timing control. Commands are decoded at a command register 8.

A control circuit 6 controls data transfer and performs write/erase/read sequence control. A status register 11 outputs Ready/Busy states of the memory card 20 to a Ready/Busy terminal. In addition to this, a status register 12 is also provided that informs the host of the states of the memory 20 (Pass/Fail, Ready/Busy, etc.) via an I/O port.

Addresses are transferred via an address register 5 to the row decoder 2 (including a pre row decoder 2a and a main row decoder 2b) or a column decoder 4. Write data is loaded via an I/O control circuit 13 through the control circuit 6 to the sense amplifier circuit 3 (including a sense amplifier 3a and a data register 3b), while read data is output via the control circuit 6 to the outside.

A high-voltage generation circuit 10 is provided for producing a high voltage required for each mode of operation.

The high-voltage generation circuit 10 produces a predetermined high voltage based on orders from the control circuit 6.

Figure 4:
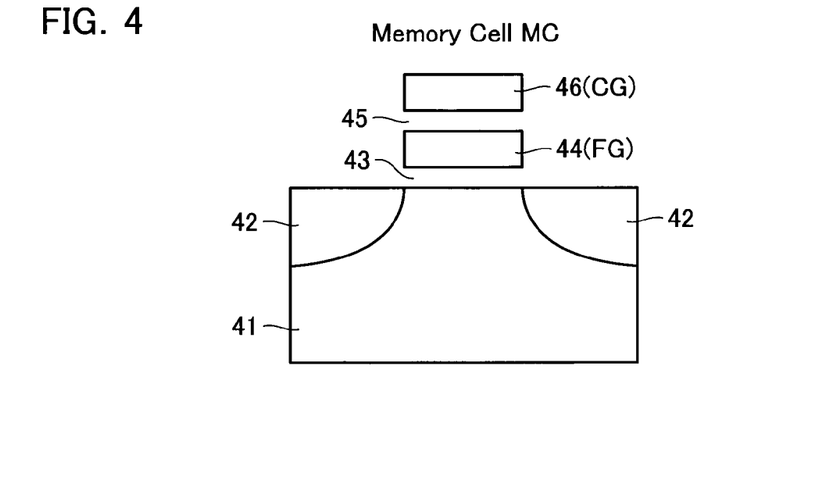
FIG. 4 is a cross-sectional view illustrating a configuration of one memory cell MC.
Figure 5:
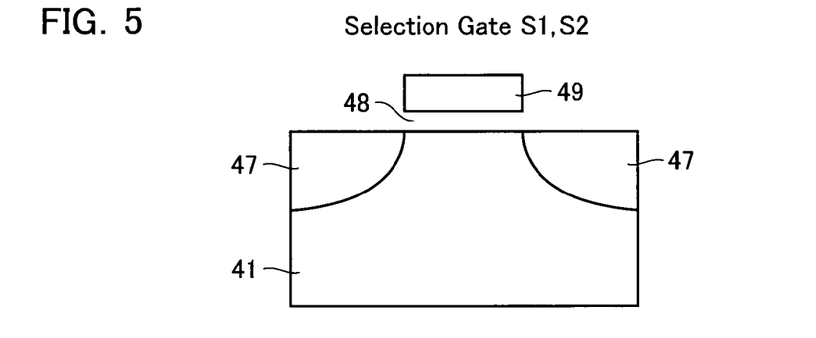
FIG. 5 is a cross-sectional view illustrating a configuration of selection transistors S1 and S2.

FIGS. 4 and 5 illustrate cross-sectional structures of one memory cell MC as well as selection gates S1 and S2, respectively. FIG. 4 illustrates a cross-sectional structure of one memory cell MC. N-type diffusion layers 42 are formed on a substrate 41, and function as the source and drain of MOSFET included in the memory cell MC. In addition, a floating gate (FG) 44 is formed on the substrate 41 via a gate insulation film 43. A control gate (CG) 46 is formed on the floating gate 44 via an insulation film 45.

Each of the selection gates S1 and S2 comprises the substrate 41 and n-type diffusion layers 47 formed on the substrate 41 as its source and drain. A control gate 49 is formed on the substrate 41 via a gate insulation film 48.

Figure 6:
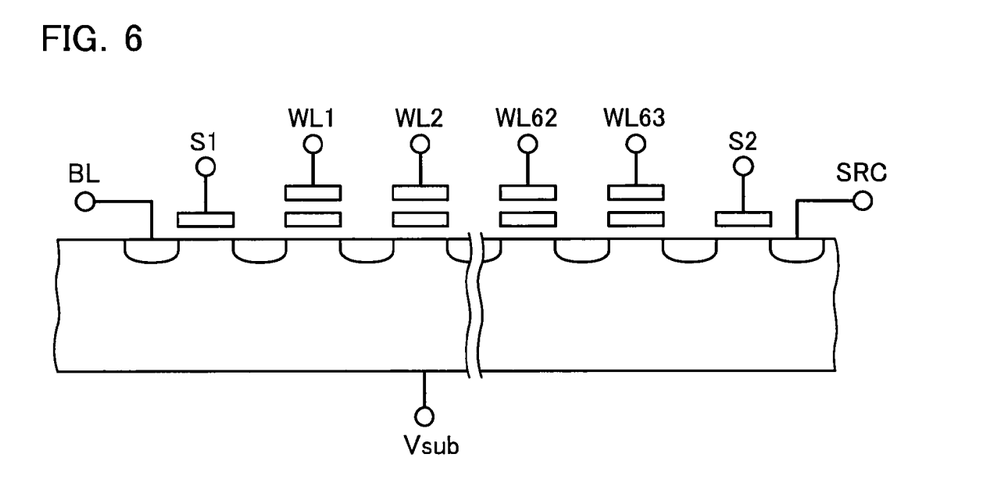
FIG. 6 is a cross-sectional view illustrating a configuration of one NAND cell unit NU.

FIG. 6 illustrates a cross section of one NAND cell of the memory cell array. In this example, one NAND cell includes 64 memory cells MC configured as illustrated in FIG. 4, which memory cells are connected in series. Provided at the drain and source sides of the NAND cell are a first selection gate S1 and a second selection gate S2 configured as illustrated in FIG. 5.

A multi-value storage operation will be described below that is performed in the NAND cell type flash memory so configured according to this embodiment. In the NAND cell type flash memory according to this embodiment of the present invention, the value of threshold voltage is controlled in eight different ways for one memory cell to cause 3 bits of data to be stored in one memory cell.

Figure 7:
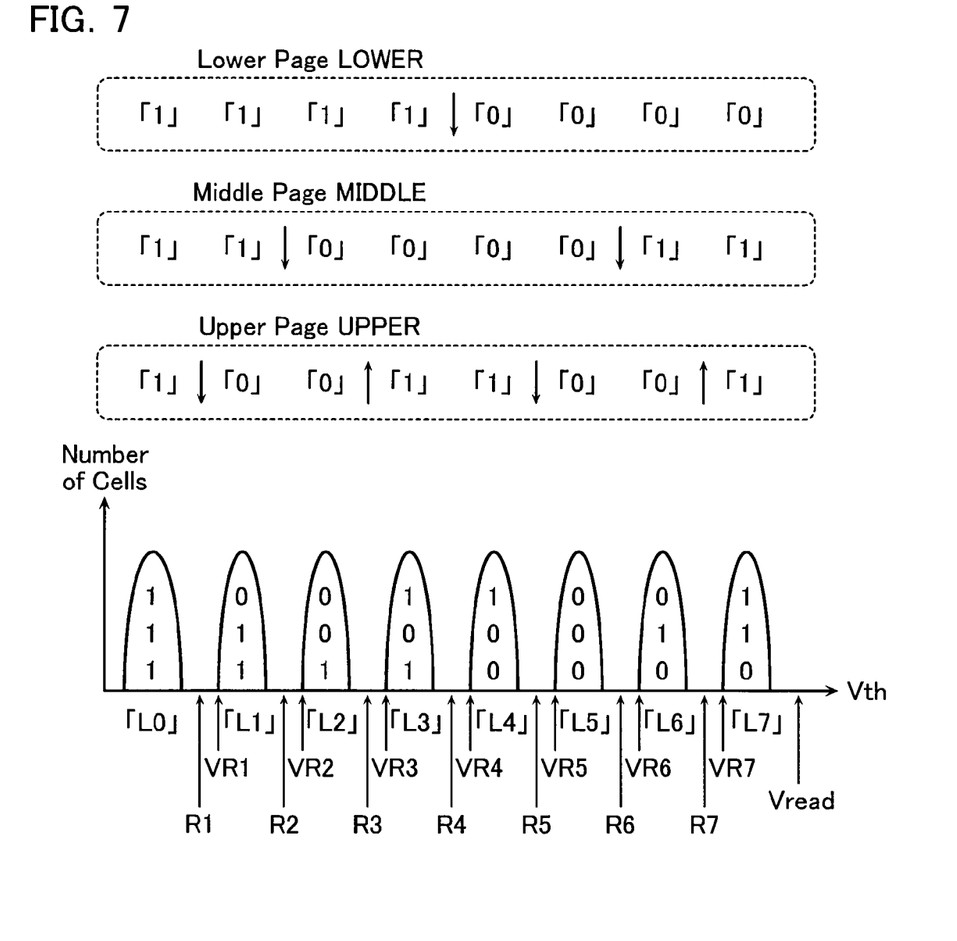
FIG. 7 illustrates the states of threshold voltage distributions (the relation between the threshold voltage Vth and the number of cells) where 3 bits of information are stored in one memory cell.

FIG. 7 illustrates threshold voltage distributions (the relation between the threshold voltage Vth and the number of cells) where 3 bits of information are stored in one memory cell. To store 3 bits of information, eight different threshold voltages are provided corresponding to eight different states of "111", "011", "001", "101", "100", "000", "010" and "110" for writing and reading information. Three sub-pages are formed for the 3 bits: upper page UPPER, middle page MIDDLE, and lower page LOWER.

Furthermore, corresponding to the eight different threshold voltage distributions, the voltage values of read voltage to be applied to a selected word line in read operation may be set to voltages R1, R2, R3, R4, R5, R6 and R7 (seven different voltages) between the threshold voltage distributions. Note that a voltage Vread to be applied to an unselected memory cell in read operation is set to be greater than the voltage of the threshold voltage distribution in state "110".

In addition, voltage values at the time of verify operation for checking the completion of information write may be set to VR1, VR2, VR3, VR4, VR5, VR6, and VR7 that are greater than the above-mentioned voltages.

Figure 8:
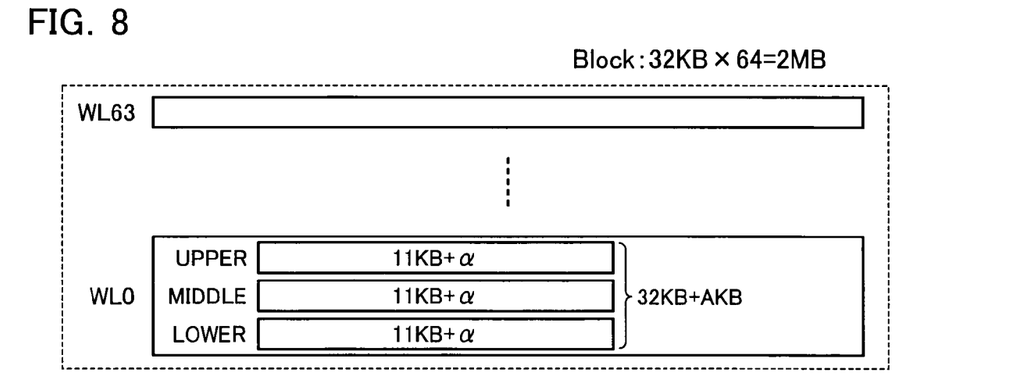
FIG. 8 is a schematic diagram illustrating a method of storing data in the memory cell array 1 of the first embodiment.

Referring now to the schematic diagram of FIG. 8, a method of storing data in the memory cell array 1 of the first embodiment will be described below. As described above, one memory cell MC can store 3 bits of data, and the number of memory cells MC formed along one word line WL is generally a power-of-two number, e.g., 16k+α, 16k plus α for storing redundant data.

However, when 3 bits of data are stored in every such 16k+α memory cell MC along one word line WL, the amount of data (effective data) that can be stored in the memory cells MC along one word line WL is 16 Kbits×3 bits=48 Kbits.

However, the resulting 48 Kbits does not correspond to a power-of-two number. Thus, there may be a mismatch with the host device treating power-of-two bits of data as a unit when 48 Kbits of data are written to the memory cells MC along one word line WL (3 bits per cell).

As such, in this embodiment, the number of bits (amount) of data (three pages of data) stored in those memory cells MC sharing one word line WL and configured to be read or written at a time is set to 32 Kbits+A Kbits. Note that 32 Kbits is a power-of-two bits, which is smaller than 48 Kbits. In addition, A Kbits represents the number of bits of redundant data and management flags for use in error correction. If such setting is done, and error correction is performed in a unit of the three pages along one word line WL, the unit of data in the memory 21 may be consistent with that in the external host device.

On the other hand, the capacity of each page (page size) is set to 11 Kbits+α Kbits, which is slightly larger than one-third of 32 Kbits mentioned above. Where A=3α Kbits+1 Kbits. The difference between 11 Kbits×3=33 Kbits and 32 Kbits, i.e., 1 Kbits are used for storing redundant data. That is, 1 Kbits+3α Kbits are prepared for redundant data and management flags for each word line WL. In other words, the amount of redundant data for error correction of three pages of data is set to be larger than 1 Kbits.

As can be seen, while 11 Kbits for each page involved in the memory cells MC formed along one word line is not a power-of-two bits, there is no problem if the number of bits of data to be stored in each page is not a power of two because the ECC circuit performs error correction for every three pages of data, as described above. Stored in the residual portion in one page is redundant data for use in error correction of effective data.

Second Embodiment

Figure 9:
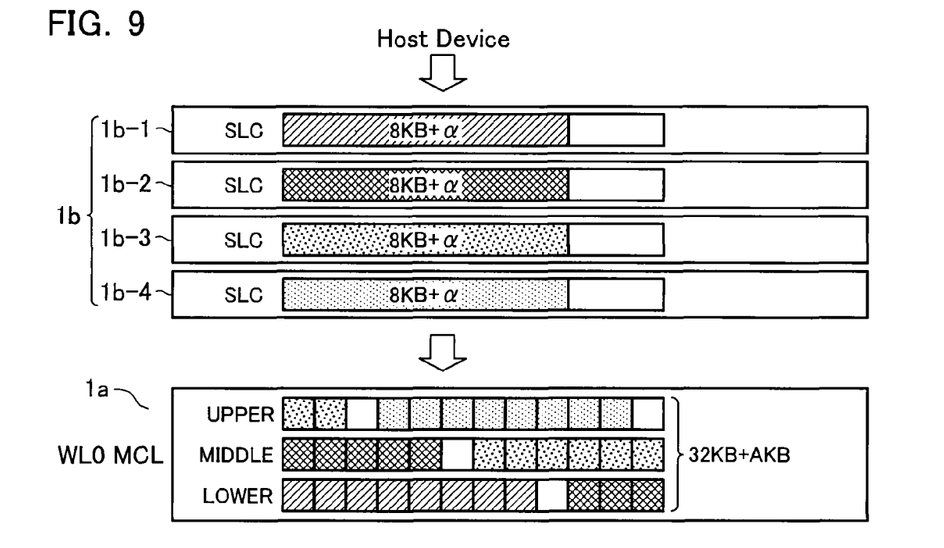
FIG. 9 is a schematic diagram illustrating a method of storing data in a memory cell array 1 according to a second embodiment.

Referring now to FIG. 9, a second embodiment of the present invention will be described below.

According to this embodiment, although the entire configuration of the semiconductor storage device is substantially the same as the first embodiment (see FIGS. 1 to 6), the data transfer procedure (scheme) of multi-value storage operation is different from the first embodiment. Thus, in the following, the data transfer procedure will be described with reference to FIG. 9, and the description of other configuration will be omitted.

This embodiment is different from the first embodiment in that data (effective data) supplied from the external host device in a unit of power-of-two number of bits (e.g., 512 bits, 1 Kbits, 2 Kbits, and so on) is first written to the binary memory region 1b, and then converted into three pages of data, which in turn are rewritten (transferred) to the multi-value memory region 1a. For example, effective data is received in 8 Kbits, which 8 Kbits of effective data are written to the binary memory region 1b with α Kbits of redundant data being added thereto. The binary memory region 1b is divided into a plurality of binary memory regions 1b-1 to 1b-4 (unit storage regions).

If the effective data stored in the binary memory regions 1b-1 to 1b-4 exceeds 32 Kbits, then the data written to the binary memory regions 1b-1 to 1b-4 is transferred again to the buffer RAM 26 in the memory controller 22, and then allocated to the three pages along one word line WL (upper page UPPER, middle page MIDDLE, and lower page LOWER).

For example, the 8 Kbits of data that are stored in the binary memory region 1b-1 will all be allocated to the lower page LOWER. The redundant data and management flags as well as some of 8 bits of data stored in the memory region 1b-2 are allocated to the residual portion of the lower page LOWER. In this way, 11 Kbits of effective data (in this case, 8 Kbits from the memory region 1b-1 and 3 Kbits from 1b-2) and α Kbits of redundant data and management flags are stored in the lower page LOWER.

In addition, excess data (in this case, 5 Kbits) from the memory region 1b-2 that may not be stored in the lower page LOWER is stored in the middle page MIDDLE. Furthermore, redundant data and management flags as well as some of 8 bits of data (in this case, 6 Kbits) stored in the memory region 1b-3 are allocated to the residual portion of the middle page MIDDLE. In this way, 11 Kbits of effective data and α Kbits of redundant data and management flags are stored in the middle page MIDDLE.

In addition, excess data (in this case, 2 Kbits) from the memory region 1b-3 that may not be stored in the middle page MIDDLE is stored in the upper page UPPER. Furthermore, redundant data and management flags as well as 8 bits of data stored in the memory region 1b-4 are allocated to the residual portion of the upper page UPPER. In this way, 10 Kbits of effective data and α Kbits of redundant data and management flags are stored in the upper page UPPER.

As such although, each of the lower page LOWER, the middle page MIDDLE, and the upper page UPPER stores data that is not power-of-two bits (11 Kbits, or 10 Kbits), these three pages in total store 32 Kbits of data which corresponds to power-of-two bits of data. Therefore, the data management unit in the memory 21 is matched with that of the external host device, providing the same advantages as the first embodiment. It should be appreciated that while the description has been made in the context of data being received from the host device in 8 Kbits in FIG. 9, the same advantages are obtained in the case of receiving data in another power-of-two number of bits.

In addition, the redundant data that is added to the binary data stored in the binary memory region 1b, as described in the above embodiment, may be stored directly in the multi-value memory region 1b and used for error correction of multi-value data. Alternatively, the redundant data added to the binary data may be used for error correction of the binary data, while additional redundant data may be generated and added for multi-value data at the ECC circuit.

Third Embodiment

Figure 10:
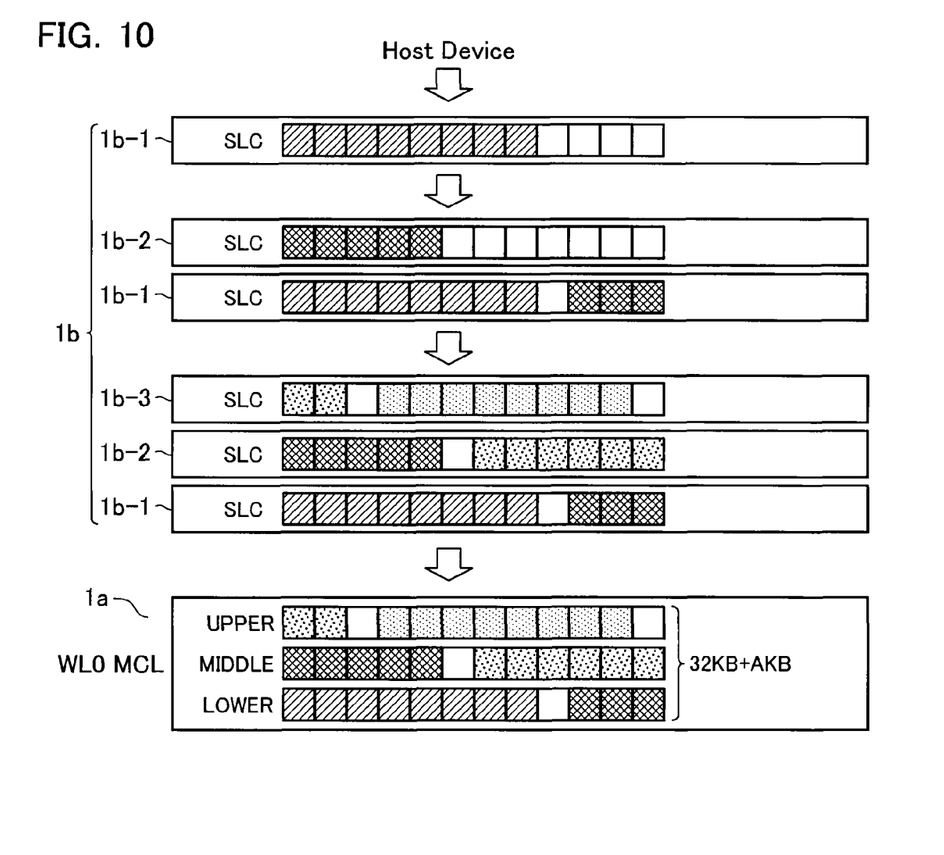
FIG. 10 is a schematic diagram illustrating a method of storing data in a memory cell array 1 according to a third embodiment.

Referring now to FIG. 10, a third embodiment of the present invention will be described below. According to this embodiment, the entire configuration of the semiconductor memory system is substantially the same as the first embodiment (see FIGS. 1 to 6). This embodiment also has the same configuration as the second embodiment in that data supplied from the external host device in a unit of a power-of-two number of bits is first written to the binary memory region 1b, and then converted into the three pages of data, which in turn are rewritten to the multi-value memory region 1a.

However, the third embodiment is different from the second embodiment in that 8 Kbits of effective data transferred from the host device, redundant data and management flags are stored in the binary memory region 1b-1, and then some (or all) of the next 8 Kbits of data transferred are stored in the residual region of the binary memory region 1b-1. Hereinbelow, as illustrated in FIG. 10, residual portions are also utilized effectively, rather than utilizing one binary memory region 1b-i (i=1, 2, 3, . . . ) for every unit of data transferred from the host device. Then, when 32 Kbits of effective data, which corresponds to data for the three pages (LOWER, MIDDLE, UPPER) is stored in the binary memory regions 1b-1 to 1b-3, data transfer to the multi-value memory region 1a is performed thereafter as described in the second embodiment. With this scheme, effective use of the storage regions of the binary memory regions 1b-1 to 1b-3 is available, without leaving redundant storage regions.

Fourth Embodiment

Figure 11:
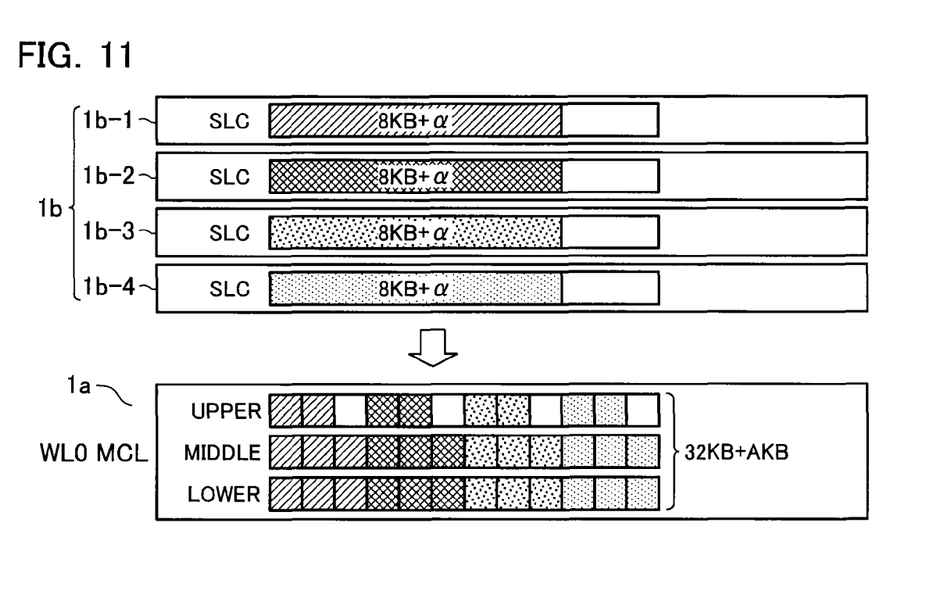
FIG. 11 is a schematic diagram illustrating a method of storing data in a memory cell array 1 according to a fourth embodiment.
Figure 12:
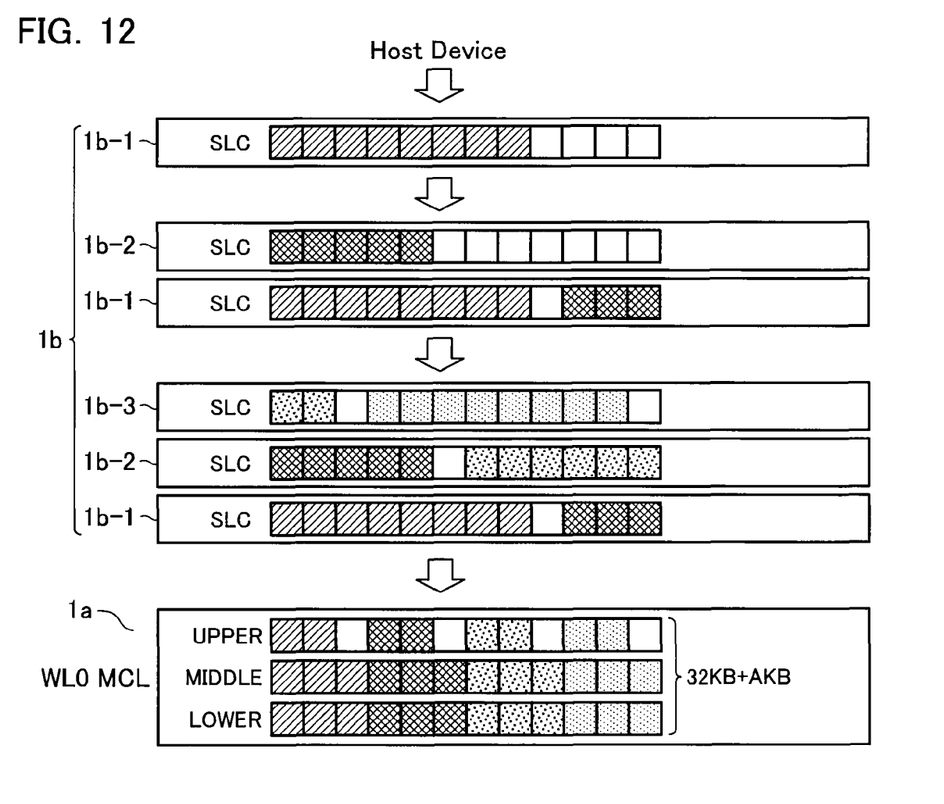
FIG. 12 is a schematic diagram illustrating a method of storing data in a memory cell array 1 according to a variation of the fourth embodiment.

Referring now to FIGS. 11 and 12, a fourth embodiment of the present invention will be described below. According to this embodiment, the entire configuration of the semiconductor memory system is substantially the same as the first embodiment (see FIGS. 1 to 6). In addition, this embodiment also has the same configuration as the second and third embodiments in that data supplied from the external host device in a unit of power-of-two number of bits is first written to the binary memory region 1b, and then converted into the three pages of data, which in turn are rewritten to the multi-value memory region 1a.

However, this embodiment is different from the above-mentioned embodiments in that data stored in the binary memory regions 1b-1 to 1b-4 is once read out to the buffer RAM 26, then rearranged on the buffer RAM 26, and further stored in the multi-value memory region 1a, with redundant data for multi-value being added thereto. The data stored in one binary memory region 1b-i is separately stored in all of the three pages, UPPER, MIDDLE, and LOWER. It should be readily apparent that while data is written to the binary memory regions 1b-1 to 1b-4 in a similar way to the second embodiment in FIG. 11, it might also be written in a similar way to the third embodiment as illustrated in FIG. 12.

[Others]

While embodiments of the present invention have been described, the present invention is not intended to be limited to the disclosed embodiments, and various other changes, additions or the like may be made thereto without departing from the spirit of the invention. For example, while the description is made in the context of 3 bits of data being stored in one memory cell in the above-described embodiments, the present invention is not so limited and may be applicable to other implementations where N bits of data (N is a natural number more than 2, other than a power-of-two) is stored in one memory cell.

In addition, the above embodiments are configured so that when a power-of-two number of bits of data are to be written from the outside as a unit of data, they are once stored in the binary memory region 1b within the memory cell array in unit of data before transferred to the multi-value memory region 1a. The present invention, however, is not so limited and may, for example, directly write data to the multi-value memory region 1a. In addition, such a configuration may be employed where the memory cell array includes a plurality of memory chips, the multi-value memory region 1a includes some of the plurality of chips, and the binary memory region 1b includes others.

What is claimed is:

1. A semiconductor memory system comprising:
a memory cell array having a plurality of memory cells arranged therein, the plurality of memory cells capable of storing N bits of information in each memory cell (where N is a natural number more than 3, other than a power of two);
a control circuit configured to control read, write, and erase operations on the memory cell array; and
an ECC circuit configured to correct data read from the memory cell array, based on redundant data,
the memory cells that share one of word lines and can be written or read at a time being configured to store multiple pages of data therein, a total amount of data stored in the multiple pages being set to a power-of-two number of bits, and the redundant data being stored in a residual portion of the multiple pages.

2. The semiconductor memory system according to claim 1, wherein
the memory cell array comprises:
a binary memory region configured to store 1 bit of information in one of the memory cells; and
a multi-value memory region formed to store the N bits of information in one of the memory cells, and
the control circuit receives from outside data that is to be written in the memory cell array, the data being supplied from outside in a unit of data with a power-of-two number of bits, stores the data in the binary memory region, and then sequentially transfers the data stored in the binary memory region to the multi-value memory region.

3. The semiconductor memory system according to claim 2, wherein
the control circuit stores the unit of data with the power-of-two number of bits separately in all of the pages in the multi-value memory region.

4. The semiconductor memory system according to claim 3, wherein
the binary memory region has a unit storage region having a capacity larger than the unit of data with a power-of-two number of bits; and
the control circuit stores the unit of data in the unit storage region, and, if the unit storage region involves any residual region, the control circuit stores in that residual region at least a part of data in another unit of data to be supplied next.

5. The semiconductor memory system according to claim 2, wherein
the binary memory region has a unit storage region having a capacity larger than the unit of data with a power-of-two number of bits; and
the control circuit stores the unit of data in the unit storage region, and, if the unit storage region involves any residual region, the control circuit stores in that residual region at least a part of data in another unit of data to be supplied next.

6. The semiconductor memory system according to claim 2, wherein
the redundant data added to the binary memory region is used for error correction of multi-value data stored in the multi-value memory region.

7. The semiconductor memory system according to claim 2, wherein
the redundant data added to the binary memory region is used for error correction of binary data.

8. The semiconductor memory system according to claim 2, wherein
the memory cell array includes a plurality of memory chips, each of the memory chips having the plurality of memory cells arranged therein;
the binary memory region includes some of the memory chips; and
the multi-value memory region includes others of the memory chips.

9. The semiconductor memory system according to claim 1, wherein
one of the multiple pages store data with a first number of bits, the first number being different from a power-of-two.

10. The semiconductor memory system according to claim 1, wherein

N=3, and the residual portion of the multiple pages is set to $3\alpha$ Kbits+1 Kbits (where $\alpha$ is a natural number).

11. The semiconductor memory system according to claim 10, wherein
the redundant data is set to have an amount of data larger than 1 Kbits.

12. The semiconductor memory system according to claim 1, wherein
each of the plurality of memory cells comprises:
a substrate;
a first diffusion layer provided on the substrate and functioning as a source and a drain;
a floating gate formed on the substrate via a first insulation layer; and
a first control gate formed on the floating gate via a second insulation layer.

13. The semiconductor memory system according to claim 1, wherein
the memory cell array comprises:
a first selection gate transistor having its one end connected to one end of each of the memory cells connected in series; and
a second selection gate transistor having its one end connected to the other end of each of the memory cells connected in series.

14. The semiconductor memory system according to claim 13, wherein
each of the first selection gate transistor and the second selection gate transistor comprises:
a substrate;
a first diffusion layer provided on the substrate and functioning as a source and a drain; and
a first control gate provided on the substrate via a first insulation layer.

15. The semiconductor memory system according to claim 1, wherein
the control circuit sets respective ones of the memory cells that are selected in write operation to have any of $2^N$ different threshold voltages, sets respective ones of the word lines selected in read operation to have respective read voltages between the threshold voltages, and sets respective ones of the word lines non-selected in read operation to have a voltage greater than the highest one of the threshold voltages.

16. The semiconductor memory system according to claim 15, wherein
when checking a completion of write operation, the control circuit sets the selected word lines to have a voltage greater than the respective read voltages positioned between the threshold voltages.

17. A semiconductor memory system comprising:
a memory cell array having a plurality of memory cells arranged therein, the plurality of memory cells capable of storing N bits of information in each memory cell (where N is a natural number more than 3, other than a power of two); and
a control circuit configured to control read, write, and erase operations on the memory cell array,
the memory cell array comprising:
a binary memory region configured to store 1 bit of information in one of the memory cells; and
a multi-value memory region formed to store the N bits of information in one of the memory cells,
the control circuit being operative to store in the binary memory region data supplied from outside in a unit of data with a power-of-two number of bits to be written to the memory cell array, and then sequentially transfer the data stored in the binary memory region to the multi-value memory region;

the memory cells that share one of word lines and can be written or read at a time being configured to store multiple pages of data therein; and a total amount of data stored in the multiple pages being set to a power-of-two number of bits, and the redundant data being stored in a residual portion of the multiple pages.

18. The semiconductor memory system according to claim 17, wherein the control circuit stores the unit of data with the power-of-two number of bits separately in all of the pages in the multi-value memory region.

19. The semiconductor memory system according to claim 17, wherein one of the multiple pages store data with a first number of bits, the first number being different from a power-of-two.

20. The semiconductor memory system according to claim 17, wherein the memory cell array includes a plurality of memory chips, each of the memory chips having the plurality of memory cells arranged therein;

the binary memory region includes some of the memory chips; and the multi-value memory region includes others of the memory chips.

* * * * *